US006545484B1

United States Patent
Yoshioka

(10) Patent No.: US 6,545,484 B1
(45) Date of Patent: Apr. 8, 2003

(54) BOARD INSPECTION APPARATUS AND BOARD INSPECTION METHOD

(75) Inventor: Yasushige Yoshioka, Okayama (JP)

(73) Assignee: OHT Inc., Hiroshima (JP)

( * ) Notice: Subject to any disclaimer, the term of this patent is extended or adjusted under 35 U.S.C. 154(b) by 0 days.

(21) Appl. No.: 09/576,890

(22) Filed: May 24, 2000

(51) Int. Cl.7 .......................... G01R 31/08; G01R 31/28
(52) U.S. Cl. ....................... 324/527; 324/530; 324/676; 324/713
(58) Field of Search ................................ 324/761, 754, 324/527, 528, 530, 532, 535, 537, 759, 713, 676

(56) References Cited

U.S. PATENT DOCUMENTS

| | | | |
|---|---|---|---|
| 4,791,357 A | * 12/1988 | Hyduke | 324/73.1 |
| 5,274,336 A | * 12/1993 | Crook et al. | 324/690 |
| 6,297,631 B1 | * 10/2001 | Ozue et al. | 324/210 |

FOREIGN PATENT DOCUMENTS

| | | |
|---|---|---|
| JP | 2000-19213 | 1/2000 |
| JP | 2000-019213 A | * 1/2000 |

* cited by examiner

Primary Examiner—Michael Sherry
Assistant Examiner—Paresh Patel
(74) Attorney, Agent, or Firm—Armstrong, Westerman & Hattori, LLP

(57) ABSTRACT

An apparatus and method capable of effective board inspection. In the board inspection apparatus wherein a pulse signal is applied to one edge of a pattern line on a board, a non-contact probe receives a signal at another edge of the pattern line, and a conduction of the pattern line is inspected in accordance with the received signal, the board inspection method comprising steps of: applying an inspection signal to the one edge of the pattern line at a predetermined time; receiving an applied timing of the inspection signal at a receiving side; and monitoring a variance of a received signal which is detected by the probe after the applied timing.

23 Claims, 8 Drawing Sheets

(a)

(d)

(b)

(e)

(c)

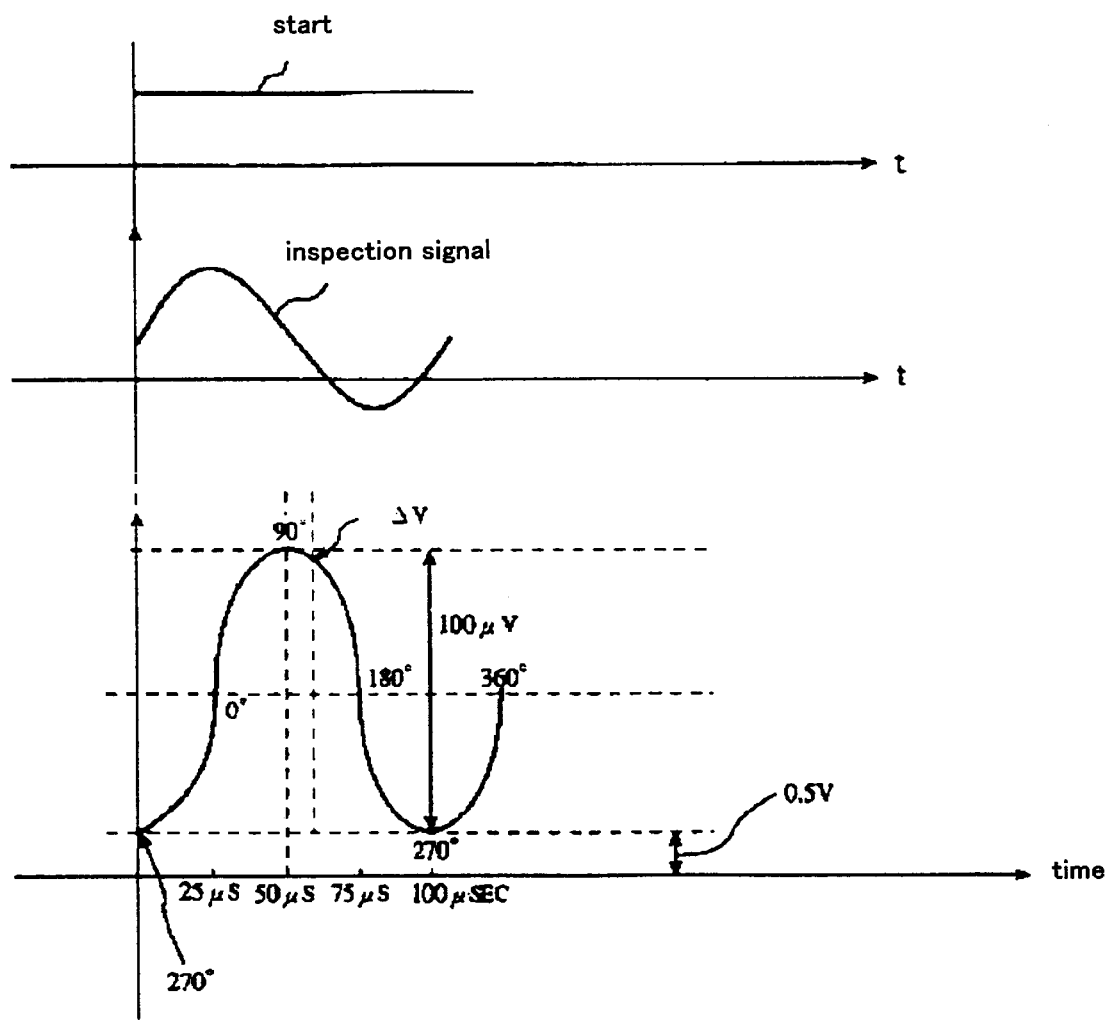
F I G. 5

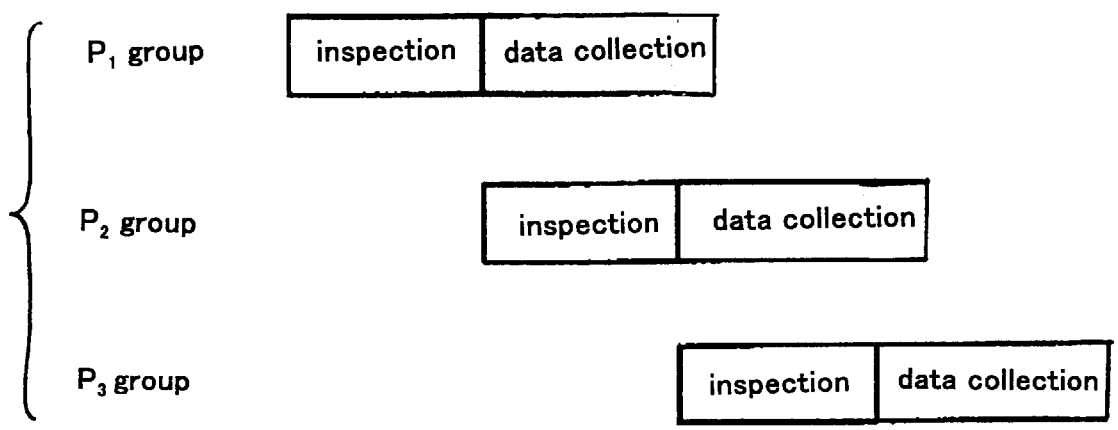
F I G. 9

BOARD INSPECTION APPARATUS AND BOARD INSPECTION METHOD

BACKGROUND OF THE INVENTION

1. Field of the Invention

The present invention relates to a board inspection apparatus and method applied for inspecting a breakage in a part of pattern on a board in which a narrow-pitch conductor pattern is printed (hereinafter, referred as to "board" where a LSI package which is in the run-up to implementing an IC chip is included in the "board").

2. Prior Art

Heretofore, an apparatus and method for detecting a conduction condition of a narrow-pitch conductor pattern printed on a board have widely been known in which a signal is applied to one edge of a pattern line of the conductor pattern, the applied signal is received at another edge of the pattern line, and the conduction condition is inspected in accordance with an amplitude of the received signal.

Such an inspection apparatus was also disclosed by the present applicant in Japanese Patent Application No. HEI08-104148 titled "an inspection apparatus using a non-contact shielded probe".

In these prior arts including Japanese Patent Application No. HEI08-104148, a pulse signal which includes an alternate current component having a predetermined frequency is used as an inspection signal. A conduction condition is judged in accordance with a size of difference between the average value calculated from a received level of the inspection signal and a threshold value.

However, in these conventional inspection method and apparatus, bags of time has been required to complete the inspection on all patterns of the board as an inspecting object due to the necessity of calculation for determining the average value, which requires a time for receiving a plural period of signal. Particularly, since a number of pattern line and terminal in existing boards is large, for example 1000 of sample number, it is necessary to spend 5 seconds for completing an inspection of one board even when it, for example, spends 5 ms to inspect one pattern line and terminal. Therefore, the improved efficiency in this field is desired.

SUMMARY OF THE INVENTION

The present invention suggests an inspection apparatus and method capable of a effective conduction inspection of a pattern line on a board. To achieve the object, according to one aspect of the present invention, there is provided a board inspection apparatus including a predetermined transmitter applying a signal to one edge of a pattern line on a board, a predetermined probe receiving a signal from another edge of the pattern line, wherein a conduction of the pattern line is inspected in accordance with the received signal, the improvement comprises an applying device for applying an inspection signal to the one edge of the pattern line at a predetermined time; an informing device for informing an applied timing of the inspection signal to a signal pick-up device, wherein the signal pick-up device includes a monitoring device for monitoring a variance of a received signal which is detected by the probe.

Since the monitoring of the signal variance may be executed after receiving the information, an effective processing in the monitoring device can be achieved. In particular, an arrival of the received signal corresponding to the inspection signal may be expected, which allows the inspection signal to be adapted to a few number of pulse signals, such as one to two, resulting in an effective processing as a whole.

The aforementioned object is applicable to an apparatus for inspecting a plurality of pattern lines. Thus, according to another aspect of the present invention, there is provided a board inspection apparatus including a predetermined transmitter applying a signal to each one edge of pattern lines on a plurality of boards, predetermined probes receiving signals from each another edge of the pattern lines, wherein each conduction of the pattern lines is inspected in accordance with the received signals, the improvement comprises a source for generating an inspection signal; a plurality of applying devices for approximately simultaneously applying an inspection signal to each the one edge of pattern lines on a plurality of boards at a predetermined time; a plurality of informing devices for informing an applied timing of the inspection signal; and a plurality of monitoring devices for monitoring a variance of each received signal which is detected by each of the probes.

In the second aspect of the present invention, each the applying device, each the informing device and the plurality of monitoring devices may be configured as one channel. Easier entire control may be achieved by making up such a channel. In addition, it becomes possible to configure the entire inspection apparatus as a modular configuration.

According to another preferable embodiment of the present invention, the predetermined transmitter may be a signal applying terminal contacting the one edge, and the probe may is a non-contact shielded probe. Further, according to other preferable embodiment of the present invention, the predetermined transmitter may be a non-contact type of signal applying terminal, and the probe may be a signal applying terminal contacting to the another edge.

That is, in the present invention, a non-contact type of probe may be applied both to the transmitting side and the receiving side, which contributes the size reduction. According to still other preferable embodiment of the present invention, the inspection signal may be a pulse having a length equal to at least one period, which contributes the speeding up of the inspection operation.

According to yet other preferable embodiment of the present invention, the inspection signal may have a sine waveform. Since no higher harmonic component is included in the sine waveform, noise resistance characteristics is enhanced in the entire inspection apparatus.

According to other preferable embodiment of the present invention, the inspection signal may have a rectangular waveform. Since a peak detection in the rectangular waveform can be rapidly and surely carried out, more effective inspection operation may be expected.

According to other preferable embodiment of the present invention, the monitoring device may detect a first peak of a waveform of the received signal after the informing. In addition, the first peak may be a primary peak after the informing, which contributes to shorten the inspection time. In this case, the board inspection apparatus may further include a detection device for detecting variant amount of the received signal from the time when the first peak is detected to the time when a subsequent second peak is detected.

According to other preferable embodiment of the present invention, the applying device may further include a signal source for generating a pulse signal, and initiate to energize the signal source at the applied timing. The inspection signal can be created within a short time by turning on/off the signal source.

According to other preferable embodiment of the present invention, the applying device may further include a signal source for continuously generating a pulse signal, and a switch connected to the signal source and to the terminal of the pattern line of the board, wherein the switch is turned off at the applied timing. Allowing to continuously energize the signal source can improve the accuracy of a waveform of the inspection signal.

To achieve the object described above, according to other aspect of the present invention, there is provided a board inspection method including steps of: applying a signal to one edge of a pattern line on a board; receiving a signal at another edge of the pattern line by a predetermined probe; inspecting a conduction of the pattern line in accordance with the received signal, the improvement comprises applying an inspection signal to the one edge of the pattern line at a predetermined time; informing an applied timing of the inspection signal to a receiving device; and monitoring a variance of a received signal which is detected by the probe after receiving the informing signal.

In particular, it is desirable to use a pipeline operation for the high speed inspection. Hereat, according to other preferable embodiment of the present invention, the board inspection method further include; a converting step for converting the received signal by A/D conversion; and a collecting step for collecting a data from the A/D conversion, wherein the converting step and the collecting step may be configured to perform a pipeline operation.

BRIEF DESCRIPTION OF THE DRAWINGS

FIG. 5 is a timing chart illustrating a principle of a processing for holding a peak in an inspection system according to embodiments and a examples:

FIG. 9 is a schematic diagram illustrating a principal of pipeline operation according to a second example.

DETAILED DESCRIPTION OF THE PREFERRED EMBODIMENTS

With reference to accompanied drawings, a board inspection system applying the present invention will be described hereinafter. While the present invention can, in view of its principal, be applied to both a non-contact type probe and a contact type probe, an inspection system of an embodiment described hereinafter uses the non-contact type which makes it possible to inspect a high density board.

[General Description]

Figure 1:
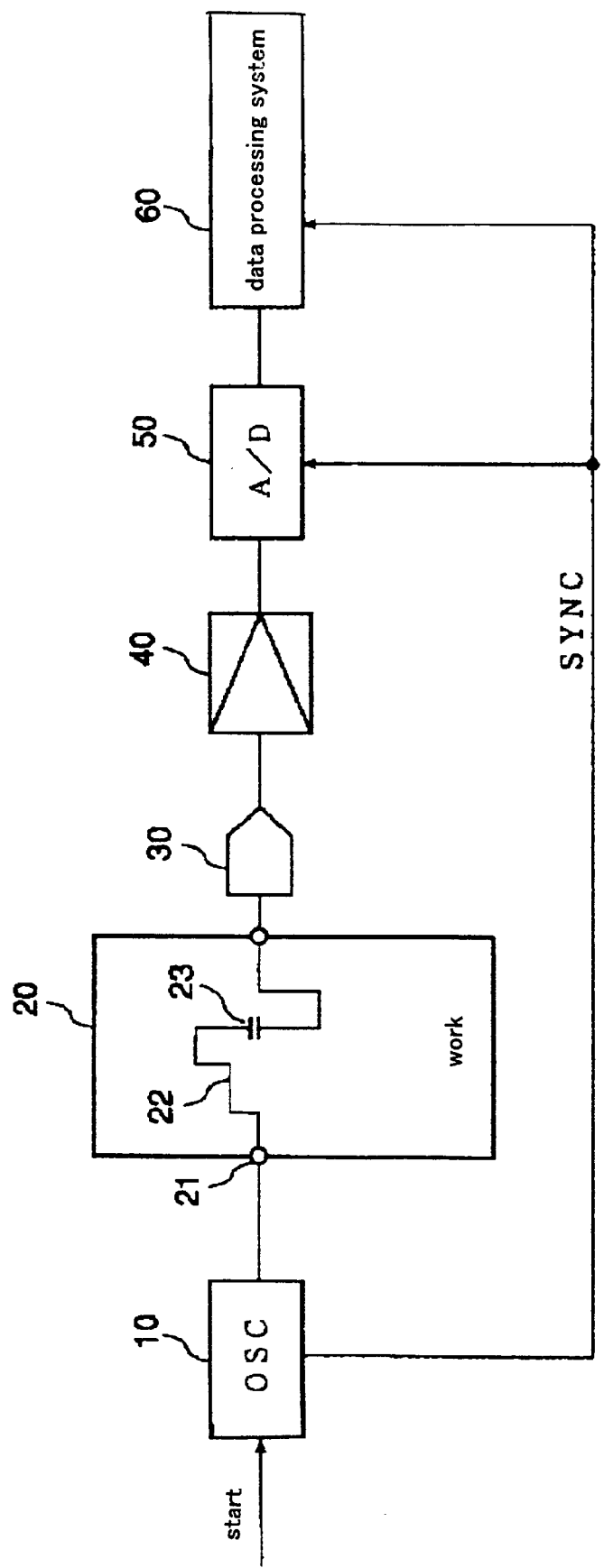
FIG. 1 is a block diagram showing a configuration of an inspection system according to a preferable embodiment of the present invention.
Figure 2:
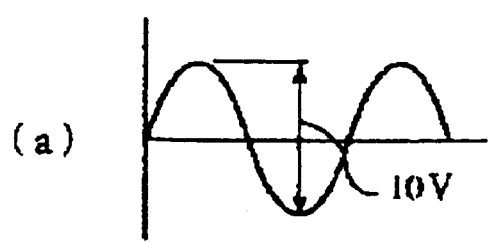
FIG. 2 is a diagram illustrating a variant in waveform of an inspection signal applied to an inspection system according to embodiments and a examples.
Figure 2:
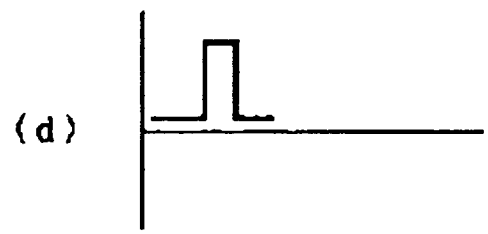
Figure 2:
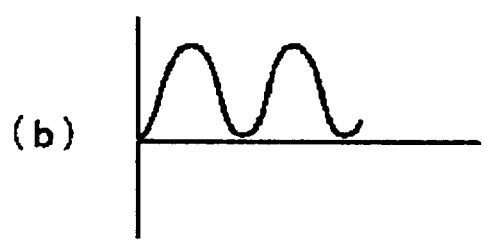
Figure 2:
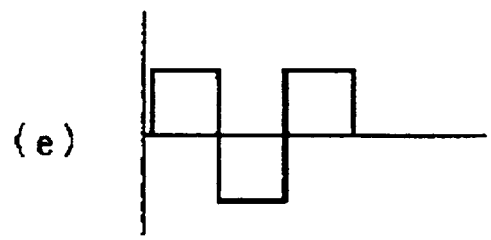
Figure 2:
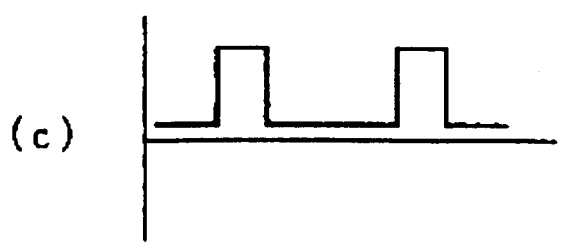

Since a basic principal of the present invention is applied to this embodiment, its configuration is simplest than other embodiments. In FIG. 1, an inspection signal is applied from signal source 10. While various waveforms, such as shown in FIG. 2, may be employed for the inspection signal, a pulse signal having a sine waveform shown FIG. 1(*a*) is employed in the embodiment other embodiments. The reason for employing the sine waveform is that it causes less EMI in comparison with a rectangular waveform. The P-P value of the signal is 50 V. The SN ratio is improved by inputting a high voltage pulse.

In FIG. 1, the reference number 20 indicates a work boarding on which a plural pattern lines 22 are thickly printed (not shown). The inspection signal is applied from the signal source 10 to a pattern line 22 through a signal cable 11 and a terminal 21. The signal cable 11, the terminal 21 on a board 20, and a connector (not shown) makes up a transmitter for applying the inspection signal to the board.

The reference number 30 indicates a bonding type non-contact shielded probe. Its detail structure is disclosed, for example in Japanese Patent Application No. HEI08-104148 owned by the present applicant, and its scheme is shown in FIGS. 3 and 4.

The reference number 40 indicates an amplifier for amplifying a signal picked up by the probe 30, and the reference number 50 indicates a A/D converter for converting analog signal to digital signal.

Figure 3:
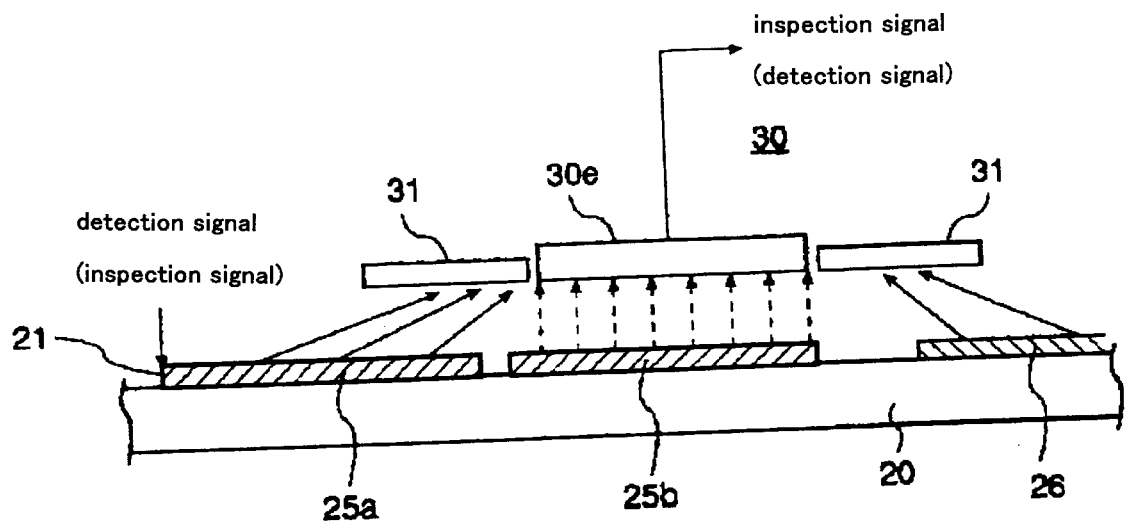
FIG. 3 is a schematic side view illustrating a structure and operation of a non-contact shielded probe and is used for an inspection system according to embodiments and a examples.
Figure 4:
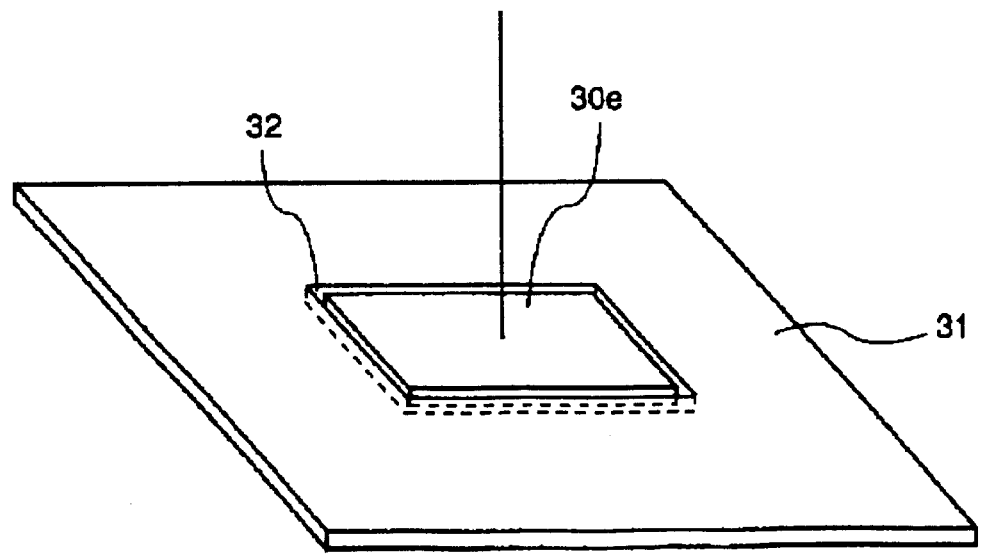
FIG. 4 a schematic perspective view illustrating a structure and operation of a non-contact shielded probe and is used for an inspection system according to embodiments and a examples.

FIG. 3 shows a structure of the probe 30. The probe 30 receives a radiation of the inspection signal from the board. To prevent receiving an unnecessary radiation, the probe has a planate shield 31 extending horizontally. FIG. 4 is a perspective view showing the shield 31. An opening is provided in the center of the shield, and an electrode 30*e* of the probe 30 is fitted into this opening. A gap 31 is provided between the electrode 30*e* and the shield 31. Preferably, the gap is filled up by an insulative adhesive to connect between the electrode and the shield and fix both.

In FIG. 3, the reference number 20 indicates a board as an inspecting object. A pattern lines 25 and 26 are disposed on the board 20, and a breakage is caused in the pattern line 25. The pattern line 25 is divided into the pattern line parts 25*a* and 25*b*. FIG. 3 shows a condition where the probe 30 is positioned above the pattern line part 25*b* by a positioning device (not shown). An electrode 21 is connected to one edge of the pattern 25*a*.

When the inspection signal is applied to the electrode 21, electric field and/or electromagnetic field is formed along the pattern line 25. In other words, a weak radiation is emitted all over the pattern line 25, and this radiation is directed to the electrode 30*e*. The pattern line part 25*b* emits no radiation due to the breakage 23, while the pattern line part 25*a* emits a radiation because the inspection signal is applied to its edge. When a pattern line 26 is connected with the pattern line 25 electromagnetically or electrostatically or ohomically, the radiation is also emitted from the pattern line 26.

If the electrode 30*e* disposed above the pattern line 25 which has the breakage 25 receives an unnecessary radiation from other pattern lines, the breakage cannot accurately be detected. Hereat, the shield 31 prevents an unnecessary radiation (radiation from the pattern line part 25*a* and the pattern line 26 in FIG. 3) from reaching to the electrode 30e. Since the pattern line part 25b emits no radiation, the electrode 30e receives no radiation, and results in zero or very low amplitude of a detection signal.

When no breakage 23 exists, the radiation from the pattern line part 25a is shielded, but the radiation emitted from the pattern line part 25b is received by the electrode 30e. Thus when the electrode 30e is adapted to connect to an amplifier (not shown), an amplified signal can be monitored to identify the presence of a breakage.

The feature of this embodiment is that a timing when the inspection signal is generated from the signal source 10 and initiations of operations in the A/D converter and the amplifier 40 (in addition, preferably data processing unit 60 subsequent to the A/D converter) are synchronized.

Thus, when a start signal is input to the signal source 10, the signal source 10 is energized to output a pulse signal to the cable 11. A synchronized signal (SYNC) is transmitted to the amplifier 40, A/D converter 50 and processing system 60 from the signal source in sync with the start signal.

This pulse signal is applied to the pattern line 22 through the terminal 21 (see FIG. 1). The probe receives the radiation from the pattern line 22, as described above, and this received signal is amplified about 300 thousand times by the amplifier 40.

FIG. 5 shows a waveform of an amplified signal. The received signal is detected at a receiving side with having a delay of about 90 degree (delay time=$25\mu$) with respect to the start signal. In this embodiment, the amplified amplitude is about 100 $\mu$Vpp. The received signal is offset about 0.5 v due to the offset voltage of the amplifier.

When a pulse signal having a shape (sine waveform having a rising edge) shown in FIG. 2(a) is applied to the board, a primary peak of a top will appear after about $25\mu$ second from the energization of the start signal.

The data processing system 60 transfers a A/D conversion start signal to the A/D converter when receiving the synchronized signal to convert the received analog signal to a digital signal by the A/D converter, and then fetches the converted data in sequence. As shown in FIG. 5, when a voltage drop of $\Delta V$ volt (=several 10 mV) is first detected after detecting a rising edge in the develop curve of the A/D converted received signal, the data processing system 60 defines this point as the primary peak of the top. Then when the primary peak of a bottom is detected, the voltage drop amount between the top and the bottom indicates a "inspection result signal" because it really corresponds to the inspection signal applied to the pattern line 22, the radiation caused from this inspection signal, and the amplified signal amplified this radiation which is received by the probe 30.

In FIG. 5, the "inspection result signal" indicates 100 V, which shows there is no breakage (open) in the pattern line 22.

In a receiving side of this embodiment, the monitoring of the signal may be started within at least $5\mu$ second after the start signal (i.e. SYNC signal). In other words, the A/D converter 50 and the data processing unit 60 may focalize the monitoring operation only as needed.

In conventional systems, since a continuous pulse signal is applied and an average value of plural received signals is calculated, when a specified number of pulses can be picked up, the pulse can use for the calculation independently of the timing when the pulse is picked up. However, it was necessary to receive plural of pulses, which requires a lot of times for the measurement as described above. In this embodiment, the amplitude width of the received signal can be determined only by one received pulse signal. Assuring to certainly receive one pulse can be achieved by regularly monitoring the signal level from the probe 30.

However, this cases a increase load to signal conditioning and the data processing. Thus in this embodiment, unnecessary signal conditioning and data processing can be reduced by executing such operation in sync with the start signal (SYNC).

While this embodiment is adapted to input the start signal from outside to the signal source 10 and to make the signal source 10 transfer the synchronized signal SYNC to the receiving side, a startup process of the present invention is not limited to such a process.

Specifically, it may be adapted to make the data processing unit 60 create the start signal and transfer it to the signal source. This means that the transferring and receiving of the inspection signal is controlled under the processing system 60.

The present invention will be described more in detail by pointing out plural of modified embodiments in which the above embodiment is further specified.

[First Embodiment]

Figure 6:
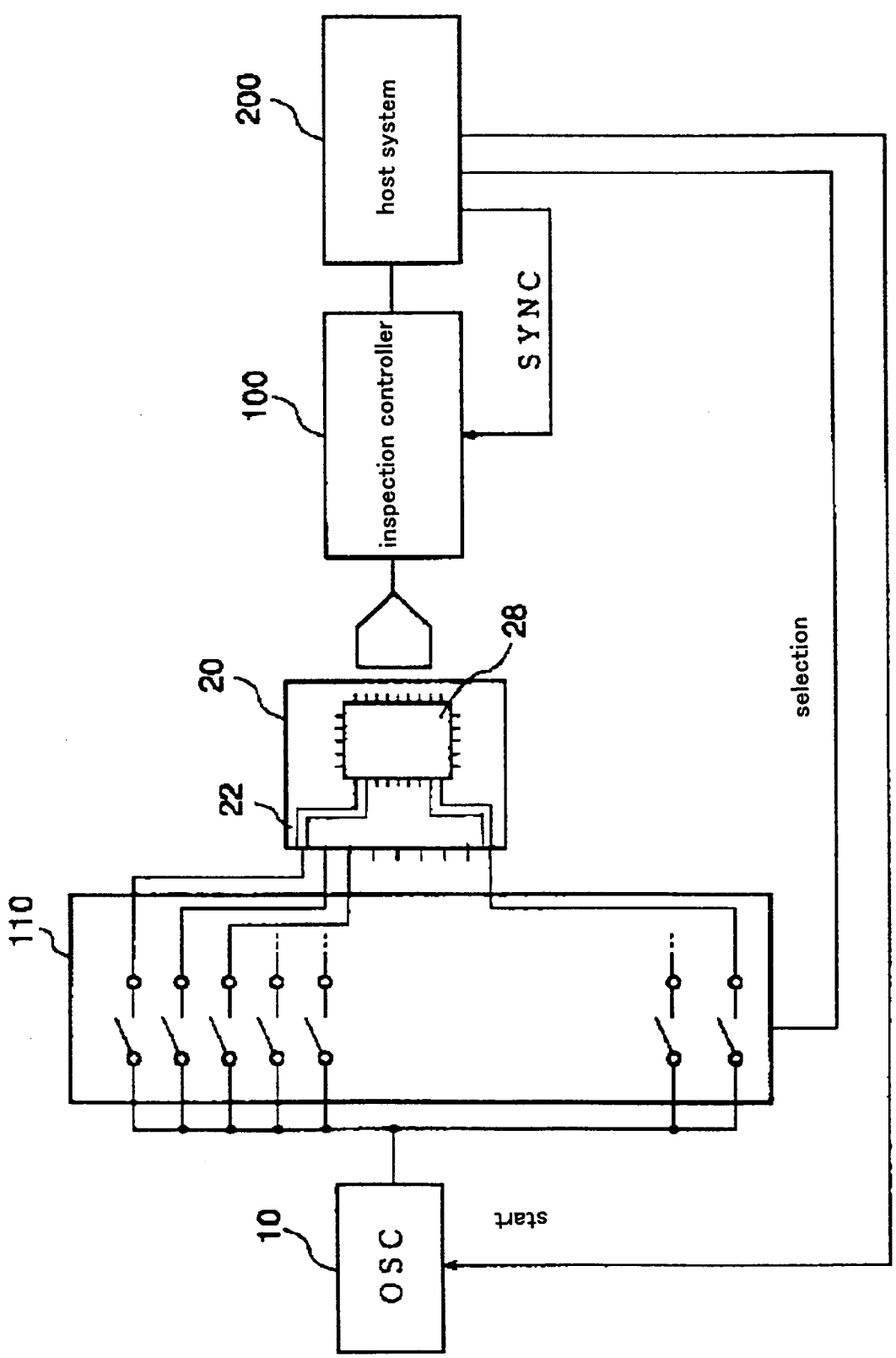
FIG. 6 is a block diagram showing a configuration of an inspection system according to a first example.

FIG. 6 shows a system configuration of the first embodiment.

In the embodiment shown in FIG. 1, the signal source 10 is directly controlled by the start signal. Accuracy of the waveform in signals is generally in low level just after the signal source (i.e. oscillator) is turned on. The feature of the first embodiment is that the signal source 10 is regularly or continuously maintained in energized condition (i.e. the condition in which oscillation is continuously maintained) and a pulse signal from the signal source 10 is turned on/off by a switch.

In FIG. 6, a switch board 110, an inspection controller 100, and a host system 200 are additionally provided to the embodiment shown in FIG. 1. The host system 200 exercises control over the entire system, and output the start signal and the SYNC signal.

Figure 7:
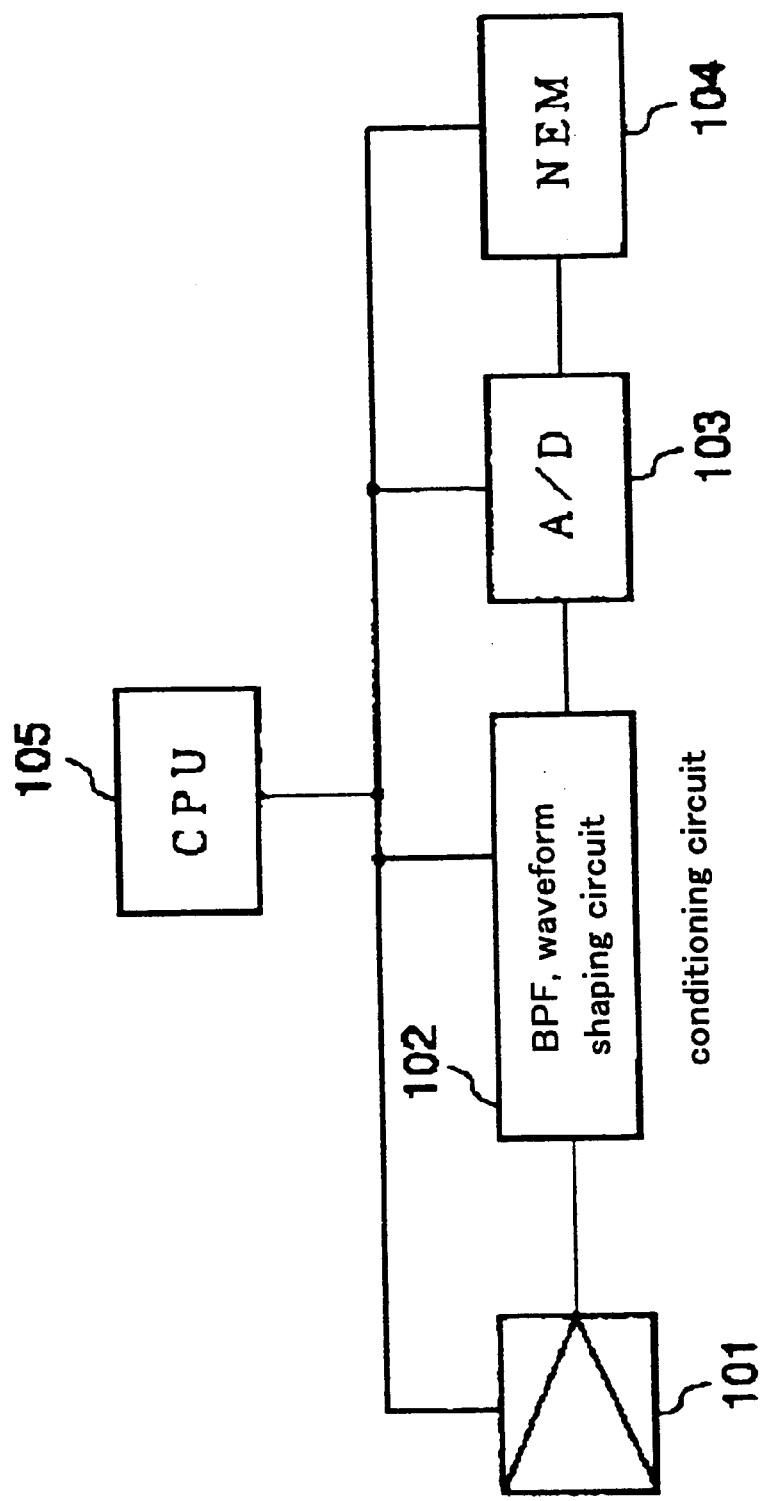
FIG. 7 is a block diagram showing a configuration of an inspection controller 100 according to a first and second example.

As shown in FIG. 7, the inspection controller 100 comprised an amplifier, BPF ( band pass filter) 101, a signal conditioning circuit 102 including waveform shaping circuit and the like, an A/D converter 103, a memory 104, and a CPU 105 controlling the entire system. The received signal is converted by the A/D converter and the converted digital value is stored in the memory 104, by a control of the CPU 105. The CPU 105 processes the data stored in the memory 104 and calculates an amplitude of the received signal. The host system 200 collects this processed result.

The work 20 in the first embodiment has number of pattern lines because the LSI 128 will be set. Thus number of inspection terminals are provided. The switch board 110 includes plural of analog switches (or lead relays ). Each analog switch ( or lead relay), the inspection terminal and the cable are previously connected each other. A test procedure including, such identifying a pattern line to be tested, is previously programmed in the host system, and the hast system control the turn on/off of each switch according to the programmed procedure. The turn on/off of each switch is operated by a selection signal from the host system.

The processes after transmitting the start signal to the detection of the peak-peak level in the received signal are same as the aforementioned embodiment.

In the first embodiment, since the probe 30 is one, only one pattern line can be tested at once. However, the signal source, the probe and the like can be communized, resulting in cost reduction.

[Second Embodiment]

Figure 8:
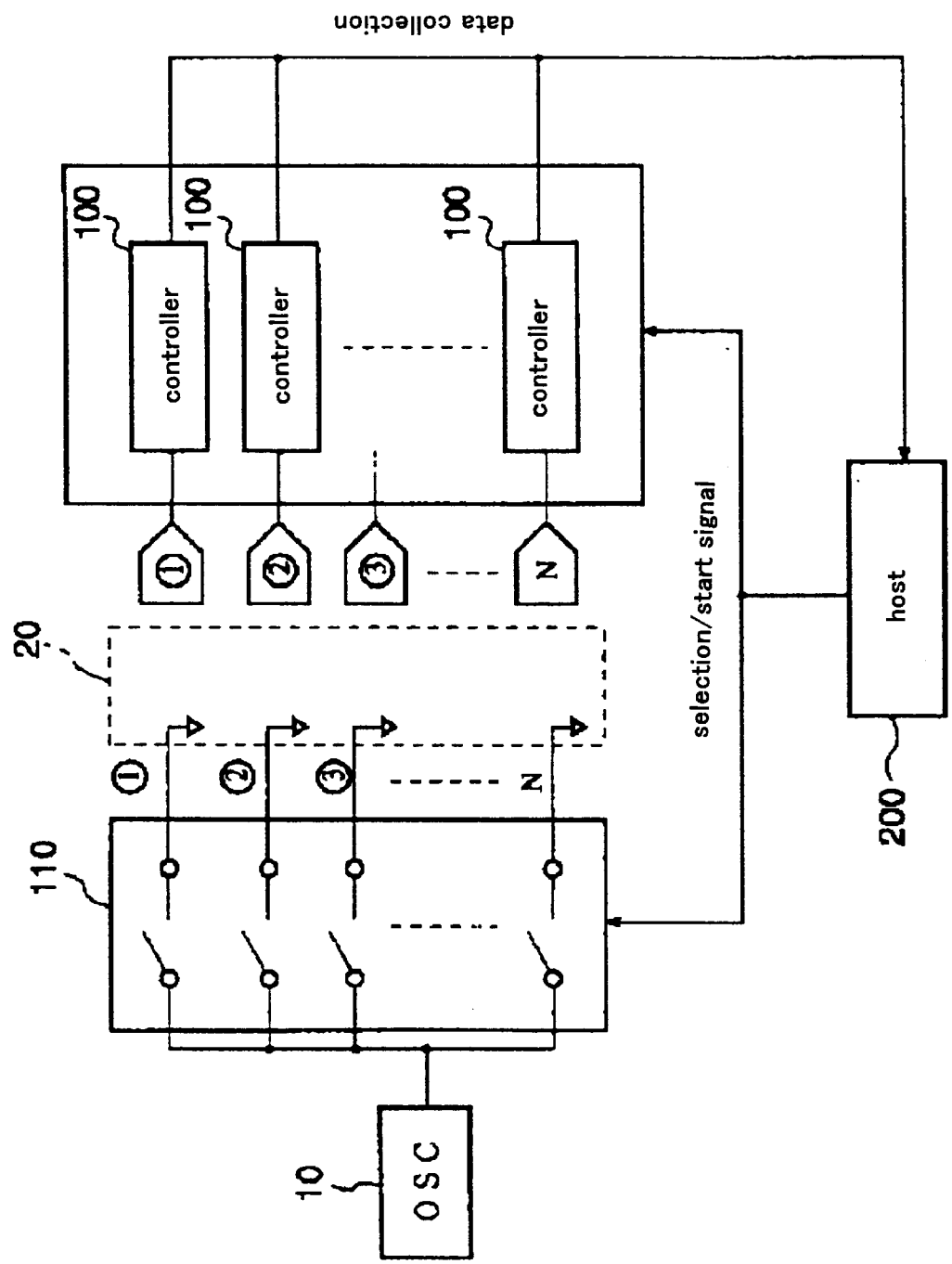
FIG. 8 is a block diagram showing a configuration of an inspection system according to a second example.

An inspection system according to the second embodiment shown in FIG. 8 makes it possible to detect a plurality of pattern lines simultaneously or with having time lag. Thus the inspection system of the second embodiment includes a plurality of probes 30, 30, --, 30 as same number as the pattern lines as an inspecting object, a plurality of inspection controller 100, 100, ---,100 as same number as the probes. That is, this inspection system has a plurality of inspection unit for N channels to allow the test for up to n of pattern lines at once.

A host 200 creates the selection/start signal N and transfer it to the inspection controller 100, 100,--, 100. When selection/start signal N is set in "1", the switch N and the controller 100N is energized and the pattern line associated with them becomes an inspecting object.

When all channels are simultaneously inspected, all selection/start signal N are simultaneously set in "1".

However, when all channel are simultaneously monitored, heave load is imposed to the host 200. Thus in the second embodiment, the host controls the selection/start signal and coordinates to be operated only a part of channels. for example, in monitoring whether an inspection result in obtained in all controllers 100, 100, --, 100 and collecting the data, assuming that the limit of the hast 200 is maximum n channels for each second, and p second is required to complete the inspection in each controller 100.

Theoretically, inspections for p×n channels can simultaneously be performed within the initial p1 (=p) second. Then, inspections for n1 channel group=p×n channels can also be performed within subsequent p2 (=p) second simultaneously. Further, inspections for n2 channel group=p×n channels can simultaneously be performed within subsequent p3 (=p) second.

As shown in FIG. 9, in term of p2 second, the hast collects the inspection date of n1 channel group which is detected in previous term of p1, and also in term of p3 second, the hast collects the inspection date of n2 channel group which is detected in previous term of p2, which allows to achieve a pipeline operation between the inspection and the data collection. the inspection speed is enhanced by this pipeline operation.

[Modification]

In the embodiments described above, while the inspection signal is directly applied on the pattern line, and the radiation of the inspecting signal is indirectly received by the non-contact shielded probe, the present invention is not limited to these. The inspecting signal may be applied onto the board by a radiation of the inspection signal through the non-contact shielded probe, its received signal may be collected by a prove with a direct connection. This reverse configuration is disclosed in Japanese Patent Application No. HEI08-104148.

Further, in the embodiments described above, the sin waveform is used as the inspection signal. However where a inspection system has the EMI resistance, a rectangular waveform may be used. when using the rectangular waveform, the speed of the peak detection can be enhanced.

Further, in the embodiments described above, since one wavelength of 10 kHz output from the signal conditioning circuit is peak-held. Therefore it is necessary to take a stable sin waveform in the preamplifier because the repeatability is significantly varied depending on the accuracy of the sin waveform. Thus, the isolation is required in the conditioning circuit, thereby, for example, a lock-in amplifier is needed in some case.

[Effect on the Invention]

As described above, according to the inspection apparatus and inspection method of the present invention, effective board inspection can be achieved.

What is claimed is:

1. A board inspection apparatus including a predetermined transmitter applying a signal to one edge of a pattern line on a board, a predetermined probe receiving the signal from another edge of said pattern line, wherein a conduction of said pattern line is inspected in accordance with said received signal, the improvement comprising:
   an applying device for applying an inspection signal to said one edge of said pattern line at a predetermined time;
   an informing device for informing an applied timing of said inspection signal to a signal pick-up device,
   wherein said signal pick-up device includes a monitoring device for monitoring a variance of a received signal which is detected by said probe, and
   wherein said monitoring device detects a first peak of a waveform of said received signal after said informing.

2. The board inspection apparatus as defined in the claim 1, wherein said predetermined transmitter is a signal applying terminal contacting to said one edge, and
   said probe is a non-contact shielded probe.

3. The board inspection apparatus as defined in the claim 1, wherein said predetermined transmitter is a non-contact type of signal applying terminal, and
   said probe is a signal applying terminal contacting to said another edge.

4. The board inspection apparatus as defined in the claim 1, wherein said inspection signal is a pulse having a length equal to at least one period.

5. The board inspection apparatus as defined in the claim 1, wherein said inspection signal has a sine waveform.

6. The board inspection apparatus as defined in the claim 1, wherein said inspection signal has a rectangular waveform.

7. The board inspection apparatus as defined in the claim 1, wherein said first peak is a primary peak after said informing.

8. The board inspection apparatus as defined in the claim 1, wherein said board inspection apparatus further includes a detection device for detecting variant amount of said received signal from the time when said first peak is detected to the time when a subsequent second peak is detected.

9. The board inspection apparatus as defined in the claim 1, wherein said applying device further includes a signal source for generating a pulse signal, and initiate to energize said signal source at said applied timing.

10. The board inspection apparatus as defined in the claim 1, wherein said applying device further includes a signal source for continuously generating a pulse signal, and a switch connected to said signal source and to a terminal of said pattern line of said board, and
    wherein said switch is turned off at said applied timing.

11. A board inspection apparatus including a predetermined transmitter applying a signal to each one edge of pattern lines on a plurality of boards, predetermined probes receiving signals from each another edge of said pattern lines, wherein each conduction of said pattern lines is inspected in accordance with said received signals, the improvement comprising:
    a source for generating an inspection signal;
    a plurality of applying devices for approximately simultaneously applying said inspection signal to each said one edge of said pattern lines on a plurality of said board at a predetermined time;
    a plurality of informing devices for informing an applied timing of said inspection signal to a plurality of pick-up devices, wherein each of said pickup-devices includes a monitoring device for monitoring a variance of each received signal which is detected by each of said probes probe, and wherein said monitoring device detects a first peak of a waveform of said received signal after said informing.

12. The board inspection apparatus as defined in the claim 11, wherein each said applying device, each said informing device and said plurality of monitoring devices are configured as one channel.

13. The board inspection apparatus as defined in the claim 11, wherein said predetermined transmitter is a signal applying terminal contacting to said one edge, and said probe is a non-contact shielded probe.

14. The board inspection apparatus as defined in the claim 11, where said predetermined transmitter is a non-contact type of signal applying terminal, and said probe is a signal applying terminal contacting to said another edge.

15. The board inspection apparatus as defined in the claim 11, wherein said inspection signal is a pulse having a length equal to at least one period.

16. The board inspection apparatus as defined in the claim 11, wherein said inspection signal has a sine waveform.

17. The board inspection apparatus as defined in the claim 11, wherein said inspection signal has a rectangular waveform.

18. The board inspection apparatus as defined in the claim 11, wherein said first peak is a primary peak after said informing.

19. The board inspection apparatus as defined in the claim 11, wherein said board inspection apparatus further includes a detection device for detecting variant amount of said received signal from the time when said first peak is detected to the time when a subsequent second peak is detected.

20. The board inspection apparatus as defined in the claim 11, wherein said applying device further includes a signal source for generating a pulse signal, and initiate to energize said signal source at said applied timing.

21. The board inspection apparatus as defined in the claim 11, wherein said applying device further includes a signal source for continuously generating a pulse signal, and a switch connected to said signal source and to a terminal of said pattern line of said board, wherein said switch is turned off at said applied timing.

22. A board inspection method including steps of:

applying a signal to one edge of a pattern line on a board;

receiving a signal at another edge of said pattern line by a predetermined probe; and inspecting a conduction of the pattern line in accordance with said received signal, the improvement comprising:

applying an inspection signal to said one edge of said pattern line at a predetermined time;

informing an applied timing of said inspection signal to a pickup device; and monitoring with a monitoring device included in said pick-up device a variance of a received signal which is detected by said probe after receiving said informing signal, wherein said monitoring device detects a first peak of a wave form of said received signal after said informing.

23. The board inspection method as defined in claim 22, further comprising;

a converting step for converting said received signal by A/D conversion; and a collecting step for collecting a data from said A/D conversion, wherein said converting step and said collecting step is configured to perform a pipeline operation.

* * * * *